United States Patent
Lang et al.

(10) Patent No.: US 11,742,053 B2
(45) Date of Patent: Aug. 29, 2023

(54) MANAGING EXECUTION OF A SCRUB OPERATION IN VIEW OF AN OPERATING CHARACTERISTIC OF A MEMORY SUBSYSTEM

(71) Applicant: Micron Technology, Inc., Boise, ID (US)

(72) Inventors: Murong Lang, San Jose, CA (US); Zhongguang Xu, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 60 days.

(21) Appl. No.: 17/467,961

(22) Filed: Sep. 7, 2021

(65) Prior Publication Data

US 2022/0013192 A1  Jan. 13, 2022

Related U.S. Application Data (63) Continuation of application No. 16/926,167, filed on Jul. 10, 2020, now Pat. No. 11,127,481.

(51) Int. Cl.
*G11C 29/50* (2006.01)
*G11C 29/12* (2006.01)
*G06F 11/10* (2006.01)
*G06F 11/07* (2006.01)
*G11C 29/44* (2006.01)

(52) U.S. Cl.
CPC ...... *G11C 29/50004* (2013.01); *G06F 11/076* (2013.01); *G06F 11/106* (2013.01); *G11C 29/12005* (2013.01); *G11C 29/44* (2013.01)

(58) Field of Classification Search
CPC ........ G11C 29/50004; G11C 29/12005; G11C 29/44; G11C 29/023; G11C 29/42; G11C 29/52; G11C 29/028; G11C 2029/0409; G11C 16/0483; G11C 16/10; G06F 11/076; G06F 11/106
See application file for complete search history.

(56) References Cited

U.S. PATENT DOCUMENTS

| | | | |
|---|---|---|---|
| 9,727,413 B2 | 8/2017 | Cordero et al. | |
| 10,042,700 B2* | 8/2018 | Brandl | G11C 29/52 |
| 2017/0269979 A1* | 9/2017 | Gollub | G06F 11/076 |
| 2018/0018217 A1* | 1/2018 | Cordero | G06F 11/1052 |

OTHER PUBLICATIONS

S. M.A. H. Jafri, S. J. Piestrak, A. Hemani, K. Paul, J. Plosila and H. Tenhunen, "Implementation and evaluation of configuration scrubbing on CGRAs: A case study," 2013 International Symposium on System on Chip (SoC), 2013, pp. 1-8, doi: 10.1109/ISSoC.2013.6675262. (Year: 2013)S. M.A. H. Jafri, S. J. Piestrak, A. Hemani, K. Paul, J. Plosila and H. Tenhunen, "Implementation and evaluation of configuration scrubbing on CGRAs: A case study," 2013 International Symposium on System on Chip (SoC), 2013, pp. 1-8, doi: 10.1109/ISSoC.2013 6675262 (Year: 2013).

\* cited by examiner

*Primary Examiner* — Ajay Ojha
(74) *Attorney, Agent, or Firm* — Lowenstein Sandler LLP (57) ABSTRACT

A value corresponding to an operating characteristic of a memory sub-system is determined. The value is compared to a threshold level to determine whether a condition is satisfied. In response to satisfying the condition, a read scrub operation associated with the memory sub-system is executed.

18 Claims, 5 Drawing Sheets

MANAGING EXECUTION OF A SCRUB OPERATION IN VIEW OF AN OPERATING CHARACTERISTIC OF A MEMORY SUBSYSTEM

CROSS-REFERENCE TO RELATED APPLICATION

This application is a continuation of U.S. patent application Ser. No. 16/926,167, filed on Jul. 10, 2020, the entirety of which is hereby incorporated by reference herein.

TECHNICAL FIELD

Embodiments of the disclosure relate generally to memory sub-systems, and more specifically, relate to managing execution of scrub operations in a memory sub-system.

BACKGROUND

A memory sub-system can be a storage system, a memory module, or a hybrid of a storage device and memory module. The memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various implementations of the disclosure.

DETAILED DESCRIPTION

Aspects of the present disclosure are directed to managing execution of scrub operations in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices. The host system can provide data to be stored at the memory sub-system and can request data to be retrieved from the memory sub-system.

The memory devices can be non-volatile memory devices, such as three-dimensional cross-point ("3D cross-point") memory devices that are a cross-point array of non-volatile memory that can perform bit storage based on a change of bulk resistance, in conjunction with a stackable cross-gridded data access array. Another example of a non-volatile memory device is a negative-and (NAND) memory device. Other examples of non-volatile memory devices are described below in conjunction with FIG. 1.

Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values. For example, a single level cell (SLC) can store one bit of information and has two logic states. The various logic states have corresponding threshold voltage levels. A threshold voltage (VT) is the voltage applied to the cell circuitry (e.g., control gate at which a transistor becomes conductive) to set the state of the cell. A cell is set to one of its logic states based on the VT that is applied to the cell. For example, if a high VT is applied to an SLC, a charge will be present in the cell, setting the SLC to store a logic 0. If a low VT is applied to the SLC, charge will be absent in the cell, setting the SLC to store a logic 1.

For certain memory types (i.e., for memory sub-systems employing certain types of storage media), error rates can vary over time. In particular, some non-volatile memories have threshold voltage programming distributions that move or "drift" higher over time. At a given read voltage level (i.e., a value of the voltage applied to a memory cell as part of a read operation), if the threshold voltage programming distributions move, then certain reliability statistics can also be affected. One example of a reliability statistic is a bit error rate (BER). The BER can be defined as the ratio of the number of erroneous bits to the number of all data bits stored in a unit of the memory sub-system, where the unit can be the entire memory sub-system, a die of memory device, a collection of codewords, or any other meaningful portion of the memory sub-system.

A read operation can be performed with a read voltage level. The read threshold voltage level or value (herein the "read voltage level") can be a particular voltage that is applied to memory cells of a memory device to read the data stored at the memory cells. For example, if a threshold voltage of a particular memory cell is identified as being below the read voltage level that is applied to the particular memory cell, then the data stored at the particular memory cell can be a particular value (e.g., '1') and if the threshold voltage of the particular memory cell is identified as being above the read voltage level, then the data stored at the particular memory cell can be another value (e.g., '0'). Thus, the read voltage level can be applied to memory cells to determine values stored at the memory cells.

In a conventional memory sub-system, when the threshold voltage programming distributions of a memory cell change, the application of the read voltage level can be inaccurate relative to the changed threshold voltage. For example, a memory cell can be programmed to have a threshold voltage below the read voltage level. The programmed threshold voltage can change over time and can shift to be above the read voltage level. For example, the threshold voltage of the memory cell can shift from initially being below the read voltage level to being above the read voltage level. As a result, when the read voltage level is applied to the memory cell, the data stored at the memory cell can be misread or misinterpreted to be at a wrong value as compared to the value as originally stored when the threshold voltage had not yet shifted.

The speed or rate of the drift of the threshold voltage programming distributions and corresponding BER of a conventional memory sub-system can be affected by one or more operating characteristics of the memory sub-system, such as changes in die temperature. In such systems, high temperature retry rates increase much faster over time as compared to lower temperature retry rates. Furthermore, the threshold voltage drifts and degrades due to thermal disturb errors and read disturb errors.

These errors can occur during the performance of a memory access operation (e.g., a read operation, a write operation, etc.) at a memory device. For example, while performing a read operation, a memory sub-system controller can misread bits representing data stored at the memory device (i.e., the stored value is read incorrectly). In another example, one or more bits representing data stored at the memory device can contain errors (i.e., the value is stored incorrectly). Either situation can result in an error during performance of a read operation (e.g., a memory access operation error). Upon detecting that a memory access operation error has occurred, the memory sub-system controller can perform an error correction operation to correct the errors in the data and perform the memory access operation again to access the corrected data. In some instances, an error correction operation can be a memory scrubbing operation, where the memory sub-system controller corrects an error in the data and writes the corrected data back to the memory device.

To address errors due to threshold voltage drift resulting from high temperatures, conventional memory sub-systems typically employ a periodic read scrub operation (e.g., a three hour read scrub where an entire memory sub-system is read once at a predetermined read scrub frequency of every three hours) and a periodic write scrub operation (i.e., a write operation that forces toggling between a '0' value to a '1' value and vice versa at a predetermined write scrub frequency, such as every twelve hours) to refresh or push the threshold voltage programming distributions down to combat the drift.

However, the execution of unnecessary read scrub and write scrub operations (e.g., over-scrubbing) degrades the quality of service of the memory sub-system due to the frequent performance of background read and write operations. In addition, 3D cross-point systems employ a same or static read scrub frequency and a same write scrub frequency during a life of the memory device. In this regard, conventional systems apply the same read scrub frequency and the same write scrub frequency for all memory devices, whether those devices are in a beginning of life (BOL) stage or an end of life (EOL) stage (e.g., where memory devices are heavily cycled resulting in a codeword error rate (CWER) that increases very fast). In such cases, the predetermined frequency is not sufficient to recover the desired CWER, thereby resulting in a greater number of errors. In addition, use of a predetermined frequency of the read scrub and write scrub operations can result in under-scrubbing, which results in data errors. Accordingly, conventional 3D cross-point systems' use of predetermined and static read scrub and write scrub frequencies fail to allow for adjustments to the frequencies due to operating characteristics of a memory device, such as temperature variations and other memory device variations.

Aspects of the present disclosure address the above and other deficiencies by having a memory sub-system that manages the execution of read scrub operations and write scrub operations based on one or more operating characteristics of a memory sub-system. In particular, the read scrub operation frequency and write scrub operation frequency can be adjusted based on one or more operating characteristics of the memory sub-system, such as a measurement or value that accounts for temperature variations and memory device variations (e.g., a lifecycle stage of a memory device such as BOL, EOL, etc.)

Advantages of the present disclosure include, but are not limited to, dynamically executing a scrub operation (e.g., a read scrub operation, a write scrub operation or both) based on one or more operating characteristics of a memory sub-system. Furthermore, the frequency associated with the read scrub and write scrub operations can be adjusted based on the one or more operating characteristics. Advantageously, the identification of a current operating characteristic and execution of a scrub operation or adjustment of one or more of the read scrub frequency and the write scrub frequency based on the operation characteristic enables the application of an optimized scrub frequency that takes into account memory device variations (e.g., a lifecycle stage of a memory device) and temperature variations. Accordingly, the scrub operation frequency can be adjusted to manage a less reliable memory device needing a higher frequency of scrub operations. Furthermore, the scrub operation frequency can be adjusted to manage temperature variations in a memory device such that a high frequency of scrub operations can be implemented for higher temperature operation of the memory device. In addition, the systems and methods of the present disclosure reduce or eliminate the read scrub frequency and avoid unnecessary read disturb errors.

Figure 1:
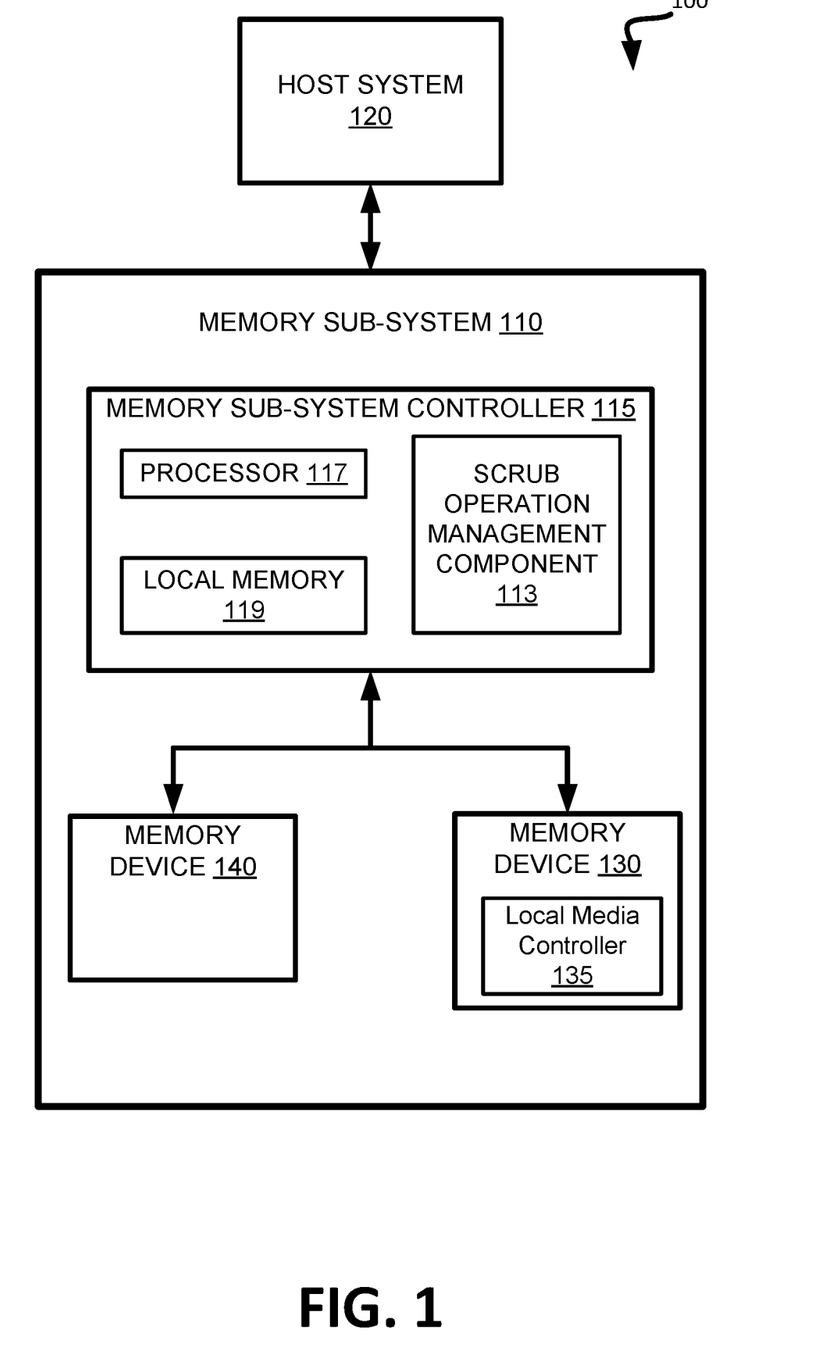
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory component can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130).

In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a scrub operation management component 113 that can be used to adjust a read scrub operation frequency and a write scrub operation frequency based on one or more operating characteristics of the memory sub-system 110. In an embodiment, the operating characteristics can be a measurement of a parameter that represents a measure of a reliability of the memory device such as a value of a threshold voltage retry rate or error correction failure rate. In an embodiment, a read retry operation is executed to re-read data as part of an error correction process. In an embodiment, multiple different read threshold voltages (e.g., read retry threshold voltage 1 ($V_{r1}$), read retry threshold voltage 2 ($V_{r2}$), read retry threshold voltage 3 ($V_{r3}$)) can be applied as part of the error correction process. In an embodiment, the scrub operation management component 113 maintains a counter to determine a number of times each respective read retry threshold voltage (e.g., $V_{r1}$, $V_{r2}$, and $V_{r3}$) is applied as part of an error correction process.

In an embodiment, a read retry rate can be determined for each of the multiple read retry threshold voltages. In an embodiment, the scrub operation management component 113 identifies a read retry rate as the operating characteristic of the memory sub-system to be monitored and used for comparison purposes. In an embodiment, the read retry threshold voltage can be preset to one of a $V_{r1}$, $V_{r2}$, or $V_{r3}$ associated with a read retry error correction process. In an embodiment, the scrub operation management component 113 uses a value of the second read retry threshold voltage ($V_{r2}$) of the error correction process as the selected read retry threshold voltage (i.e., the operating characteristic) for use in determining adjustments to the read scrub frequency, the write scrub frequency, or both, as described in greater detail below.

In an embodiment, the scrub operation management component 113 compares the selected read retry rate (e.g., the operating characteristic) to a first threshold level to determine if a first condition is satisfied. In an embodiment, the first condition is satisfied if the read retry rate is greater than the first threshold level. In an embodiment, the first threshold level is a predetermined or preset level (e.g., $1 \times 10^{-7}$) for comparison to the value of the operating characteristic (e.g., the read retry rate). In an embodiment, the first threshold level can represent an acceptable (e.g., maximum) read retry rate, such that when the operating characteristic exceeds the acceptable read retry rate, the scrub operation management component 113 manages the read scrub operation of the memory sub-system 110. For example, in response to determining the first condition is satisfied (e.g., the measured read retry rate exceeds the acceptable read retry rate), the scrub operation management component 113 executes a read scrub operation. In an embodiment, the scrub operation management component 113 compares the selected read retry rate to a second threshold level to determine if a second condition is satisfied. In an embodiment, the second condition is satisfied if the read retry rate is greater than the second threshold level. In response to determining the second condition is satisfied, the scrub operation management component 113 executes a write scrub operation. In an embodiment, the second threshold level is a predetermined or preset level (e.g., $1 \times 10^{-6}$) for use in comparing the measured read retry rate value to determine if scrub operation management is needed. For example, if the measured read retry rate exceeds the second present level (e.g., $1 \times 10^{-6}$), the scrub operation management component 113 can execute a write scrub operation as part of the error correction processing. In an embodiment, the second threshold level can be predetermined or preset to any value representing a maximum acceptable read retry rate, which, if exceeded, triggers or causes a scrub management operation (e.g., execution of write scrub operation).

In another embodiment, the scrub operation management component 113 can establish an initial or first read scrub frequency level and a first write scrub frequency level associated with the memory sub-system. The initial or first read scrub frequency (e.g., execute every 3 hours) and first write scrub frequency (e.g., execute every 12 hours) can be established at a BOL stage of the memory device. In this embodiment, the scrub operation management component 113 can determine a value corresponding to an operating characteristic of the memory sub-system, such as a read retry rate of a read retry threshold voltage (e.g., $V_{r2}$). The read retry rate is compared to a threshold level to determine if a condition is satisfied (e.g., the read retry rate is greater than the threshold level). If the condition is satisfied and the read retry rate exceeds the threshold level, the scrub operation management component 113 executes a write scrub operation. In an embodiment, the threshold level is a predetermined or preset level (e.g., $1 \times 10^{-7}$) representing a maximum acceptable read retry rate for comparison to the value of the operating characteristic (e.g., the measured read retry rate). In an embodiment, the condition is satisfied if the value is greater than the threshold level (e.g., the measured read retry rate exceeds the maximum acceptable read retry rate). In an embodiment, the condition is satisfied if the read retry rate corresponding to $V_{r2}$ is greater than the threshold level.

In addition, upon satisfaction of the condition, the scrub operation management component 113 adjusts the first or initial read scrub frequency level to an adjusted read scrub frequency level as set forth in a data structure. In an embodiment, the data structure identifies multiple read scrub frequency levels, and upon satisfaction of the condition, the scrub operation management component 113 determines a current read scrub frequency level and adjusts the read scrub frequency level to a next level as identified in the data structure. The scrub operation management component 113 also adjusts the first or initial write scrub frequency level to an adjusted write scrub frequency level (e.g., a decreased write scrub frequency value as determined in view of a data structure identifying multiple different write scrub frequency levels, as shown in the example in FIG. 4).

In an embodiment, the scrub operation management component 113 maintains a data structure (e.g., a look-up table) including multiple steps or levels of different read scrub and write scrub frequencies that are to established as conditions and parameters of the memory sub-system 110 change resulting in changes to the operating characteristic (e.g., the measured read retry rate). In an embodiment, the data structure can include read scrub and write scrub frequencies levels that have predetermined values representing different adjustments or changes to the scrub frequencies. The values can be set in a manner to reflect a desired or optimized write scrub frequency value and read scrub frequency value that corresponds to the changes in the operating characteristic (e.g., the read retry rate). For example, the values for the different levels can be set such that the write scrub and read scrub frequencies decrease at each level. Upon determining the read retry rate is greater than the threshold level, the scrub operation management component 113 identifies a next step or level (e.g., via the execution of a look-up operation of the table) and applies the read scrub frequency and write scrub frequency corresponding to the next step. In an embodiment, the scrub operation management component 113 iteratively checks the selected read retry rate and compares it to the threshold level to determine if a further adjustment to the read scrub and write scrub frequencies is to be made by moving to a next step or level as set forth in the table. This enables the read scrub and write scrub frequencies to be adjusted throughout the lifecycle of the memory device 130, 140 to account for device and temperature variations.

Figure 2:
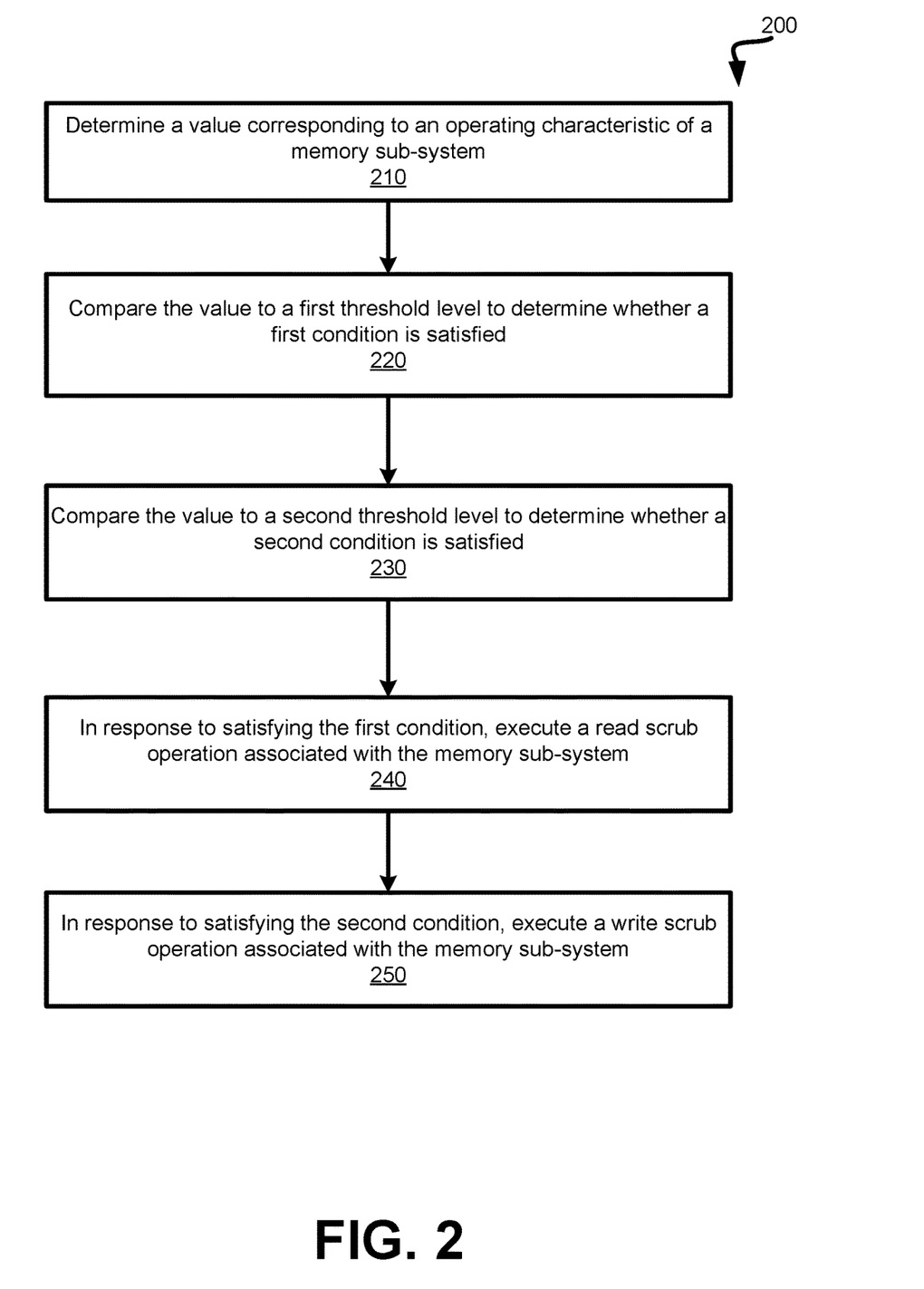
FIG. 2 is a flow diagram of an example method to execute a read scrub operation and a write scrub operation based on an operating characteristic of a memory sub-system in accordance with some embodiments.

FIG. 2 is a process flow diagram of an example method 200 to manage the execution of read scrub and write scrub operations based on one or more operating characteristics of a memory sub-system in accordance with some embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the scrub operation management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, in operation 210, the processing logic (e.g., the scrub operation management component 113) determines a value corresponding to an operating characteristic of a memory sub-system. In an embodiment, the operating characteristic can include a selected read retry rate. In an embodiment, the selected read retry rate can be a selected read retry threshold voltage (e.g., $V_{r2}$) count (e.g., number of times the selected read retry threshold voltage is applied as part of read retry operation) as compared to a total read retry threshold voltage count (e.g., a count associated with $V_{r1}$, $V_{r2}$, and $V_{r3}$). In an embodiment, the selected read retry rate can be the read retry rate associated with a second read retry threshold voltage ($V_{r2}$) of a set of read retry threshold voltage (e.g., a set including a first read retry threshold voltage ($V_{r1}$), the second read retry threshold voltage ($V_{r2}$) and a third read retry threshold voltage ($V_{r3}$)). In an embodiment, the value corresponding to the second read retry rate (e.g., the selected operating characteristic) can be represented by the following equation:

$$V_{r2} \text{ Read Retry Rate} = V_{r2} \text{ read retry count}/(V_{r1} \text{ read retry count} + V_{r2} \text{ read retry count} + V_{r3} \text{ read retry count}).$$

In operation 220, the processing logic compares the value to a first threshold level to determine if a first condition is satisfied. In an embodiment, the first threshold level is a predetermined or preset level (e.g., $1 \times 10^{-7}$) for comparison to the value of the operating characteristic (e.g., the selected read retry rate). In an embodiment, the first condition is satisfied if the identified value is greater than the first threshold level. In an embodiment, the first condition is satisfied if the second read retry rate (e.g., the rate corresponding to $V_{r2}$) is greater than the first threshold level.

In operation 230, the processing device compares the value to a second threshold level to determine if a second condition is satisfied. In an embodiment, the second threshold level is a predetermined or preset level (e.g., $1 \times 10^{-6}$) for comparison to the value of the operating characteristic (e.g., the selected read retry rate). In an embodiment, the second condition is satisfied if the identified value is greater than the second threshold level. In an embodiment, the second condition is satisfied if the second read retry rate (e.g., the rate corresponding to $V_{r2}$) is greater than the second threshold level.

In operation 240, in response to satisfying the first condition, the processing logic executes a read scrub operation associated with the memory sub-system. In an embodiment, if the Vt2 read retry rate exceeds the first threshold level, the processing logic executes a read scrub operation.

In operation 250, in response to satisfying the second condition, the processing logic executes a write scrub operation associated with the memory sub-system. In an embodiment, if the Vt2 read retry rate exceeds the second threshold level, the processing logic executes a write scrub operation.

Advantageously, operations 210-250 can be performed by the processing logic iteratively over the lifecycle of a memory device to dynamically manage and execute read scrub and write scrub operations in view of changing operational characteristics caused by memory device variations and temperature variations.

Figure 3:
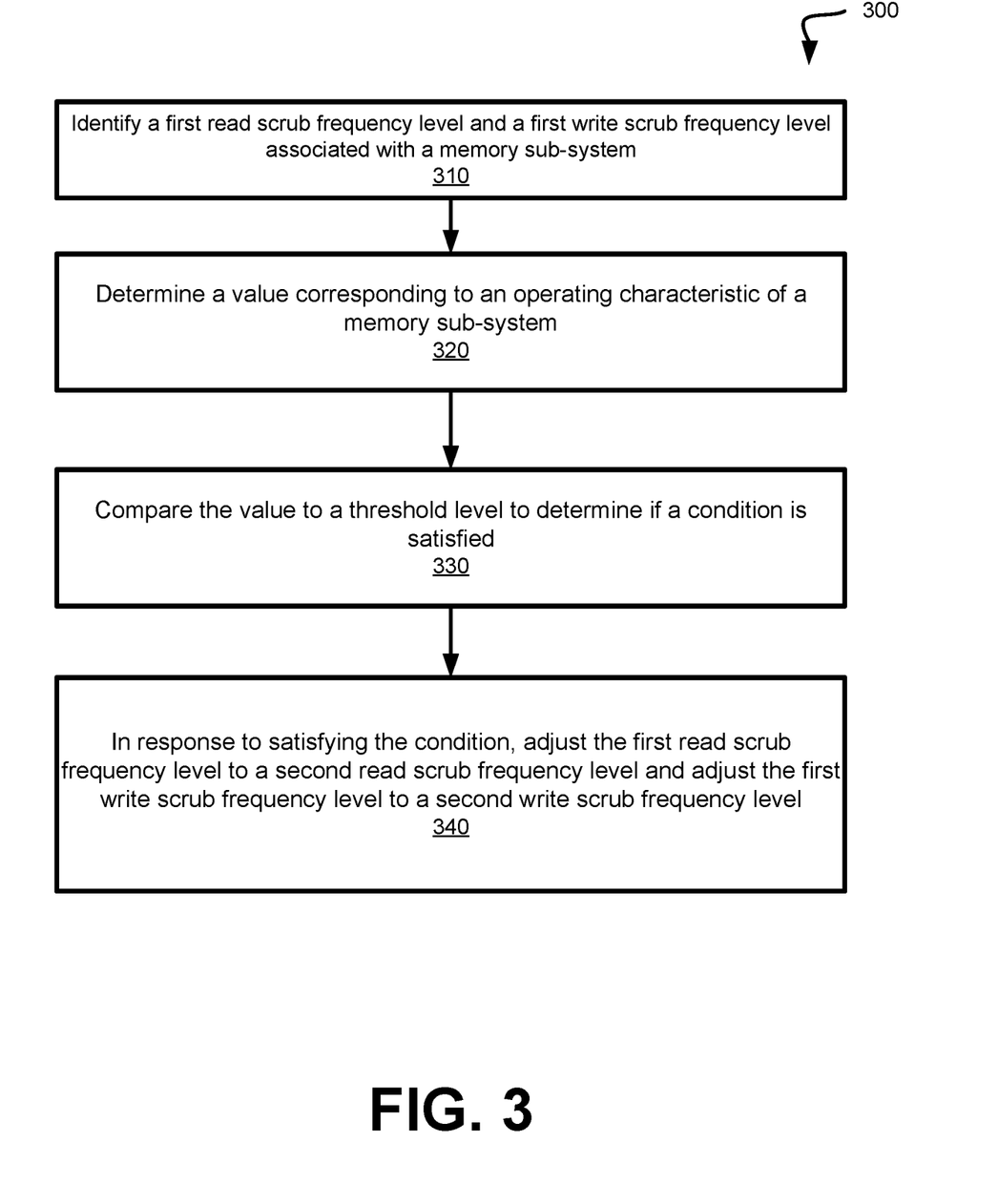
FIG. 3 is a flow diagram of an example method to adjust a read scrub frequency and a write scrub frequency based on an operating characteristic of a memory sub-system in accordance with some embodiments.

FIG. 3 is a process flow diagram of an example method 300 to adjust a read scrub frequency and a write scrub frequency based on one or more operating characteristics of a memory sub-system in accordance with some embodiments. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the scrub operation management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 3, in operation 310, the processing logic identifies a first read scrub frequency level and a first write scrub frequency level associated with a memory sub-system. In an embodiment, the first read scrub frequency level can be an initial frequency established at a BOL stage of a memory device which indicates the frequency for executing a read scrub operation. For example, the first read scrub frequency level can indicate that a read scrub operation is to be executed every X number of hours (e.g., where X equals 3).

Figure 4:
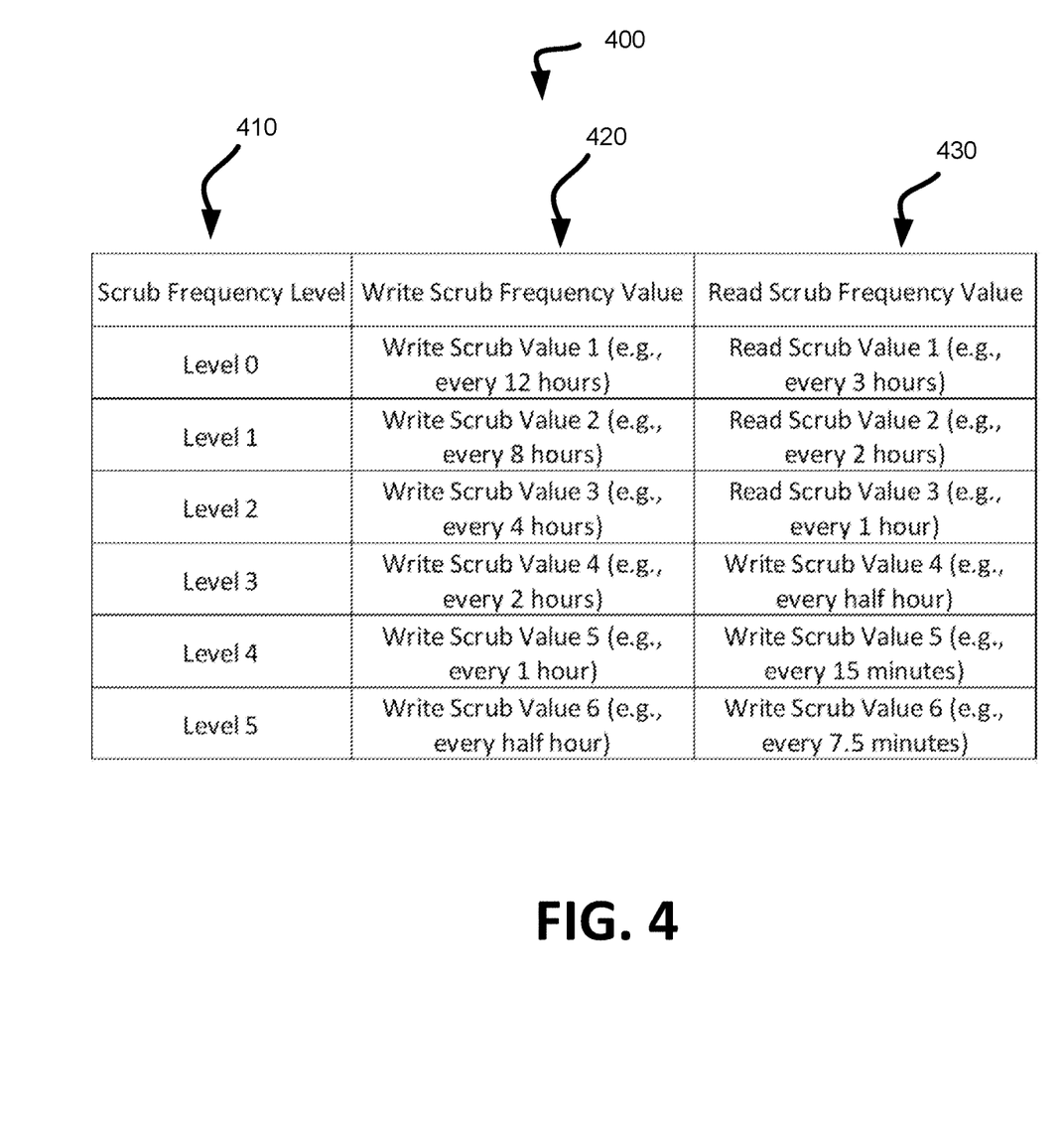
FIG. 4 illustrates a table including example scrub frequency levels including corresponding read scrub frequencies and write scrub frequencies for adjusting a memory sub-system in accordance with some embodiments.

In an embodiment, the processing logic can maintain a data structure including multiple steps or levels of read scrub frequencies and write scrub frequencies, as shown in the example table 400 of FIG. 4. As shown in FIG. 4, multiple steps or levels (referred to as scrub frequency levels 410) are established, with each level having a corresponding write scrub frequency value 420 and a read scrub frequency value 430. For example, the first read scrub frequency level and a first write scrub frequency level of operation 310 can be identified by determining the frequency values corresponding to Level 0 (e.g., a BOL stage setting). In the example shown in FIG. 4, the first read scrub frequency level is 3 hours (e.g., a read scrub operation is to be performed every 3 hours when the memory device is set to Level 0) and the first write scrub frequency level is 12 hours (e.g., a write scrub operation is to be performed every 12 hours when the memory device is set to Level 0).

In operation 320, the processing logic determines a value corresponding to an operating characteristic of a memory sub-system. In an embodiment, the operating characteristic can be a read retry rate associated with a selected read retry threshold voltage level (e.g. $V_{r2}$), as described above in connection with FIG. 1. In an embodiment, the multiple counters can be maintained to monitor and record the read retry counts for the multiple different read retry threshold voltage levels (e.g., a counter for the $V_{r1}$ count, a counter for the $V_{r2}$ count, and a counter for the $V_{r3}$ count). In an embodiment, the processing logic can check the multiple counters to determine the operating characteristic (e.g., the $V_{r2}$ read retry rate) following a set number of write cycles (e.g., the counters can be checked every 20K write cycles).

In operation 330, the processing logic compares the value to a threshold level to determine if a condition is satisfied. In an embodiment, the threshold level is a predetermined or preset level (e.g., $1 \times 10^{-7}$) for comparison to the value of the operating characteristic (e.g., the measured read retry rate). In an embodiment, the condition is satisfied if the value is greater than the threshold level. In an embodiment, the condition is satisfied if the second read retry rate (e.g., the read retry rate corresponding to $V_{r2}$) is greater than the threshold level.

In operation 340, in response to satisfying the condition, the processing logic adjusts the first read scrub frequency level to a second read scrub frequency level and adjusts the first write scrub frequency level to a second write scrub frequency level. In an embodiment, the processing logic determines the second read scrub frequency (e.g., the next read scrub frequency) and the second read scrub frequency by executing a look-up operation using a data structure such as the example table 400 shown in FIG. 4. In an embodiment, the processing logic examines the table 400 to determine a next scrub frequency level. Continuing the example above wherein the current level is Level 0, the processing logic identifies Level 1 as the next level in the progression. The processing logic then identifies the read scrub frequency level (e.g., read scrub frequency 2) and the write scrub frequency level (e.g., write scrub frequency 2) corresponding to Level 1. In this example, the processing logic adjusts the read scrub frequency from 3 hours to 2 hours. In this example, the processing logic adjusts the write scrub frequency from 12 hours to 8 hours.

In an embodiment, operations 310-350 can be performed iteratively (e.g., every set number of write cycles) to enable the processing logic to repeatedly adjust the read scrub frequency and write scrub frequency throughout the lifecycle of a memory device. Continuing the example above, following the identification of an operating characteristic value that exceeds the threshold value, the processing logic can adjust the read scrub frequency of Level 1 to an adjusted read scrub frequency associated with Level 2 (e.g., every 1 hour) and adjust the write scrub frequency of Level 1 to an adjusted write scrub frequency associated with Level 2 (e.g., every 4 hours). The iterations can continue to enable progression through the multiple levels and adjustments of the read scrub and write scrub frequencies. In an embodiment, in response to satisfying the condition, the processing logic can also execute a write scrub operation, in addition to adjusting the read scrub and write scrub frequencies.

Figure 5:
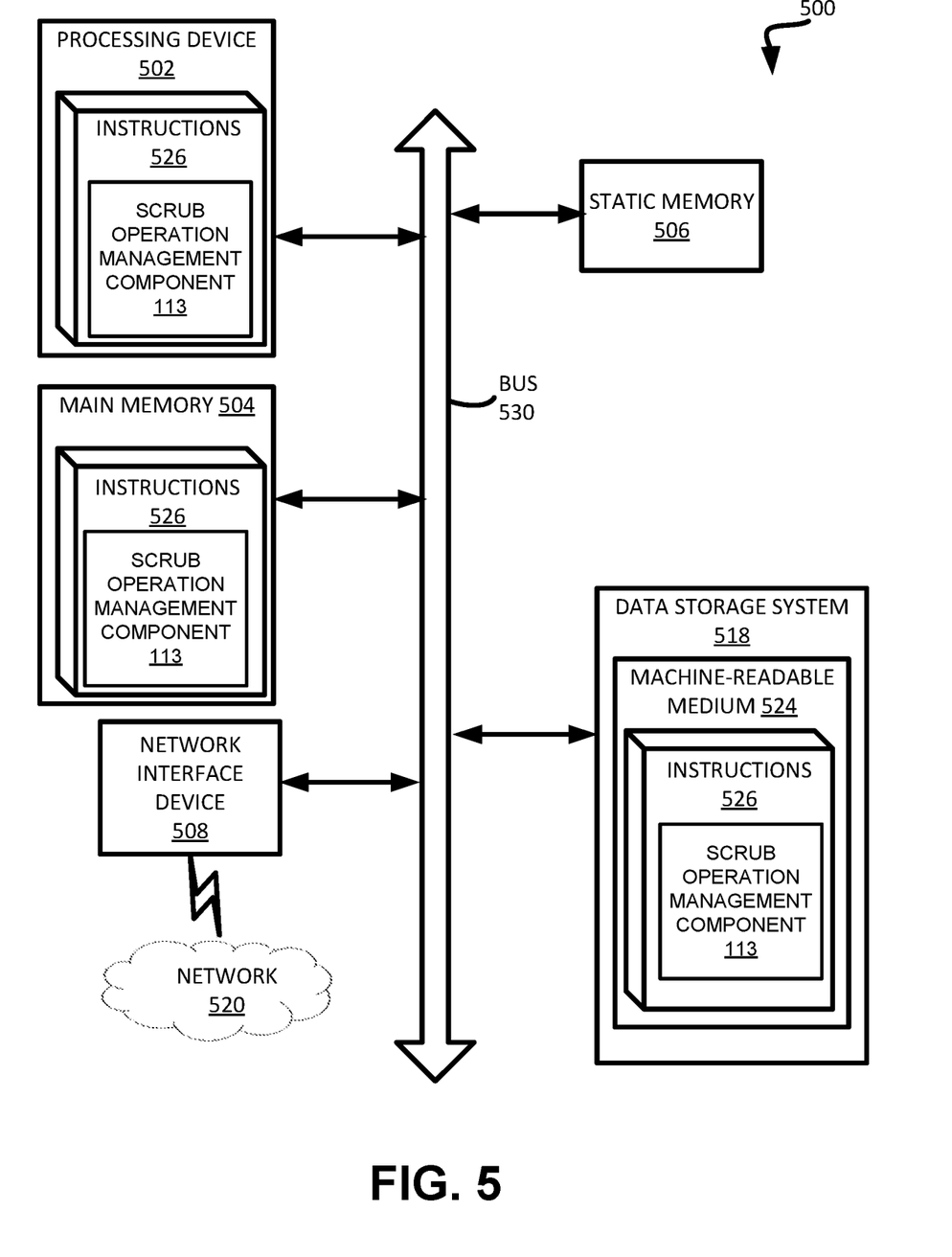
FIG. 5 is a block diagram of an example computer system in which implementations of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a scrub operation management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a read voltage adjustment component (e.g., the scrub operation management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    determining, by a processing device, a value corresponding to an operating characteristic of a memory sub-system;
    comparing the value to a threshold level to determine that a condition is satisfied;
    in response to determining that the condition is satisfied, executing a first read scrub operation associated with the memory sub-system;
    determining a further value corresponding to the operating characteristic of the memory sub-system; and
    in response to determining that the further value satisfies the condition, executing a second read scrub operation associated with the memory sub-system.

2. The method of claim 1, wherein the operating characteristic comprises a read retry rate associated with a read retry threshold voltage level.

3. The method of claim 2, wherein the read retry threshold voltage level is selected from a set of read retry threshold voltage levels comprising a first read retry threshold voltage level, a second read retry threshold voltage level, and a third read retry threshold voltage level.

4. The method of claim 2, wherein the read retry rate is determined based on a first count of read retry operations associated with a second read retry threshold voltage level compared to a sum of counts of read retry operations associated with a plurality of read retry threshold voltage levels.

5. The method of claim 1, wherein the condition is satisfied upon determining the value is greater than the threshold level.

6. The method of claim 1, further comprising comparing the value to a further threshold level to determine if a further condition is satisfied.

7. The method of claim 6, further comprising in response to determining that the further condition is satisfied, executing a write scrub operation.

8. The method of claim 1, further comprising:
    in response to determining the further value is greater than a further threshold level, executing a write scrub operation associated with the memory sub-system.

9. A non-transitory computer readable medium comprising instructions, which when executed by a processing device, cause the processing device to perform operations comprising:

maintaining a data structure comprising a plurality of scrub frequency levels, wherein each scrub frequency level comprises a read scrub frequency level and a write scrub frequency level;

identifying, using the data structure, a first read scrub frequency level associated with a memory sub-system;

determining a value corresponding to an operating characteristic of a memory sub-system;

comparing the value to a threshold level to determine that a condition is satisfied; and in response to determining that the condition is satisfied, adjusting the first read scrub frequency level to a second read scrub frequency level.

10. The non-transitory computer readable medium of claim 9, the operations further comprising identifying a first write scrub frequency level.

11. The non-transitory computer readable medium of claim 10, the operations further comprising in response to satisfying the condition, adjusting the first write scrub frequency level to a second write scrub frequency level.

12. The non-transitory computer readable medium of claim 9, the operations further comprising:

in response to satisfying the condition, performing a look-up operation of the data structure to identify the second read scrub frequency level.

13. The non-transitory computer readable medium of claim 9, the operations further comprising:

in response to determining the condition is satisfied, executing a write scrub operation.

14. The non-transitory computer readable medium of claim 9, the operations further comprising:

determining a further value corresponding to the operating characteristic of the memory sub-system;

comparing the further value to the threshold level to determine whether the condition is satisfied; and in response to determining the condition is satisfied, adjusting the second read scrub frequency level to a third read scrub frequency level.

15. The non-transitory computer readable medium of claim 14, wherein the second read scrub frequency level is greater than the third read scrub frequency level.

16. A system comprising:

a memory component; and a processing device, operatively coupled with the memory component, the processing device to execute instructions to perform operations comprising:

determining a value corresponding to an operating characteristic of a memory sub-system;

comparing the value to a threshold level to determine that a condition is satisfied;

in response to determining the condition is satisfied, executing a read scrub operation associated with the memory sub-system;

determining a further value corresponding to the operating characteristic of the memory sub-system; and in response to determining that the further value satisfies the condition, executing a second read scrub operation associated with the memory sub-system.

17. The system of claim 16, wherein the condition is satisfied upon determining the value is greater than the threshold level.

18. The system of claim 16, the operations further comprising:

comparing the value to a further threshold level to determine if a further condition is satisfied; and in response to determining the condition is satisfied, executing a write scrub operation.

* * * * *